(12) United States Patent
Chen et al.

(10) Patent No.: US 8,058,725 B2
(45) Date of Patent: Nov. 15, 2011

(54) PACKAGE STRUCTURE AND PACKAGE SUBSTRATE THEREOF

(75) Inventors: Kuang-Hsiung Chen, Kaohsiung (TW); Chen-Ming Cheng, Kaohsiung (TW); Hung-Ju Chung, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 353 days.

(21) Appl. No.: 11/870,251

(22) Filed: Oct. 10, 2007

(65) Prior Publication Data

US 2008/0105974 A1 May 8, 2008

(30) Foreign Application Priority Data

Nov. 6, 2006 (TW) .............................. 95141044 A

(51) Int. Cl.
*H01L 23/495* (2006.01)
(52) U.S. Cl. .................. 257/738; 257/667; 257/E23.02; 257/E23.06; 438/106
(58) Field of Classification Search .................. 257/781, 257/668, E21.499, 738, E23.02, E23.06, 257/E23.063; 607/36; 29/840; 438/106
See application file for complete search history.

(56) References Cited

U.S. PATENT DOCUMENTS

| | | | | | |
|---|---|---|---|---|---|
| 5,786,239 | A | * | 7/1998 | Ohsawa et al. | 438/123 |
| 6,013,946 | A | * | 1/2000 | Lee et al. | 257/684 |
| 6,144,102 | A | * | 11/2000 | Amagai | 257/781 |
| 6,489,667 | B1 | * | 12/2002 | Shim et al. | 257/668 |
| 6,772,512 | B2 | * | 8/2004 | Tsai et al. | 29/840 |
| 6,818,989 | B2 | * | 11/2004 | Higuchi et al. | 257/738 |
| 2002/0095192 | A1 | * | 7/2002 | Pu et al. | 607/36 |
| 2002/0119595 | A1 | * | 8/2002 | Kim et al. | 438/106 |

* cited by examiner

*Primary Examiner* — Matthew E Warren
*Assistant Examiner* — Fang-Xing Jiang
(74) *Attorney, Agent, or Firm* — J.C. Patents

(57) ABSTRACT

A package structure and a package substrate thereof are provided. The package structure includes a package substrate, a chip and a molding compound. The package substrate has an upper surface and a lower surface. The lower surface has a molding area and a pad area. The molding area has at least one window opening penetrating the upper surface and the lower surface. The pad area is used for disposing at least one solder ball or at least one connecting pin. The package substrate includes a solder mask. The solder mask covers the lower surface of the package substrate. The solder mask has at least one groove. The groove is disposed between the molding area and the pad area. The chip disposed on the package substrate has an active surface. The active surface contacts with the upper surface of the package substrate. The molding area is covered by the molding compound.

16 Claims, 4 Drawing Sheets

PACKAGE STRUCTURE AND PACKAGE SUBSTRATE THEREOF

CROSS-REFERENCE TO RELATED APPLICATION

This application claims the priority benefit of Taiwan application serial no. 95141044, filed on Nov. 6, 2006. All disclosure of the Taiwan application is incorporated herein by reference.

BACKGROUND OF THE INVENTION

1. Field of the Invention

The present invention relates to a package structure and a package substrate thereof. More particularly, the present invention relates to a package structure and a package substrate thereof, capable of using a solder mask to form a groove to prevent a molding compound from contaminating a pad area.

2. Description of Related Art

The appearance of semiconductor chips is an important milestone of the modern science and technology. Generally, the semiconductor chip must be protected by a package structure, so as to protect the semiconductor chip from being affected by moistures or from being crashed. Referring to FIG. 1, it is a schematic view of a conventional package structure 900. The package structure 900 includes a package substrate 910, a chip 920, and a molding compound 930. The chip 920 is carried on the package substrate 910. The package substrate 910 has at least one wire-bonding pad 911 and at least one solder-ball mounting pad 912. An active surface 920a of the chip 920 is electrically connected to the wire-bonding pad 911 via a bonding wire 940. The molding compound 930 covers the cover chip 920 and the bonding wire 940, so as to protect the chip 920 and the bonding wire 940 from being affected by moistures or being crashed. A solder ball 950 is disposed on the solder-ball mounting pad 912, for connecting to a printed circuit board (not shown in FIG. 1), such that the internal circuit of the chip 920 is electrically connected to the printed circuit board through the bonding wire 940, the wire-bonding pad 911, internal wires of the package substrate 910, the solder-ball mounting pad 912, and the solder ball 950.

As the electronics are continuously developed towards a trend of "light, thin, short, and small", the volume of the package structure 900 also must be reduced to cater to such an era trend. Generally, a certain space is required to connect the bonding wire 940 from the active surface 920a of the chip 920 to the wire-bonding pad 911 of the package substrate 910. Furthermore, after the molding compound 930 covers the bonding wire 940 and the active surface 920a of the chip 920, the whole structure 900 occupies a certain volume. Accordingly, in the package structure 900 of FIG. 1, the wire-bonding pad 911 and the solder-ball mounting pad 912 are disposed on the same surface of the package substrate 910. The package substrate 910 exposes the active surface 920a of the chip 920 via an opening 910c. Therefore, when the molding compound 930 covers the bonding wire 940 and the active surface 920a of the chip 920, the volume occupied by the molding compound 930 is greatly reduced. The package structure similar to the package structure 900 of FIG. 1 is a window ball grid array (WBGA) package structure, which has been increasingly widely used in various products, and recently, the main application is to be used on the package structure of a memory.

However, the molding compound 930 is a fluid. In the packaging process, after the molding compound 930 covers the bonding wire 940 and the active surface 920a of the chip 920, the molding compound 930 is cured upon being heated. Therefore, during the manufacturing process, the molding compound 930 may flow towards the solder-ball mounting pad 912 along a surface of the package substrate 910, such that the structural strength of the adhesion between the solder ball 950 and the solder-ball mounting pad 912 is seriously affected, and the product yield is greatly reduced.

Besides the problem that the molding compound contaminates the solder-ball mounting pad, in the WBGA package structure of FIG. 1, the package structure with the molding compound and any pad located on the same surface as the package substrate has the similar problem. Therefore, it is one of the important directions for the current research and development of how to solve the above problem.

SUMMARY OF THE INVENTION

Accordingly, the present invention is directed to a package structure and a package substrate thereof, using a structural design of a solder mask with a groove to prevent a mold flow of a molding compound flowing from a molding area to a pad area, such that the package structure and the package substrate thereof at least have advantages of "the molding compound is effectively prevented from contaminating the pad area", "it is suitable for the package substrate with dense internal circuits", "the defective rate is lowered", and "the manufacturing cost is not increased additionally".

As embodied and broadly described herein, a package structure is provided. The package structure includes a package substrate, a chip, and a molding compound. The package substrate has an upper surface and a lower surface. The lower surface has a molding area and a pad area. The molding area has at least one window opening penetrating the upper surface and the lower surface. The pad area is used for disposing at least one solder ball or at least one connecting pin. The package substrate includes a solder mask for covering the lower surface of the package substrate. The solder mask has at least one groove disposed between the molding area and the pad area. The chip disposed on the package substrate has an active surface. The active surface contacts with the upper surface of the package substrate. The molding area is covered by the molding compound.

Furthermore, a package substrate is provided. The package substrate has an upper surface and a lower surface. The lower surface has a molding area and a pad area. The molding area is used to dispose a molding compound, and has at least one window opening penetrating the upper surface and the lower surface. The pad area is used for disposing at least one solder ball or at least one connecting pin. The package substrate includes a solder mask for covering the lower surface of the package substrate. The solder mask has at least one groove disposed between the molding area and the pad area.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 1:
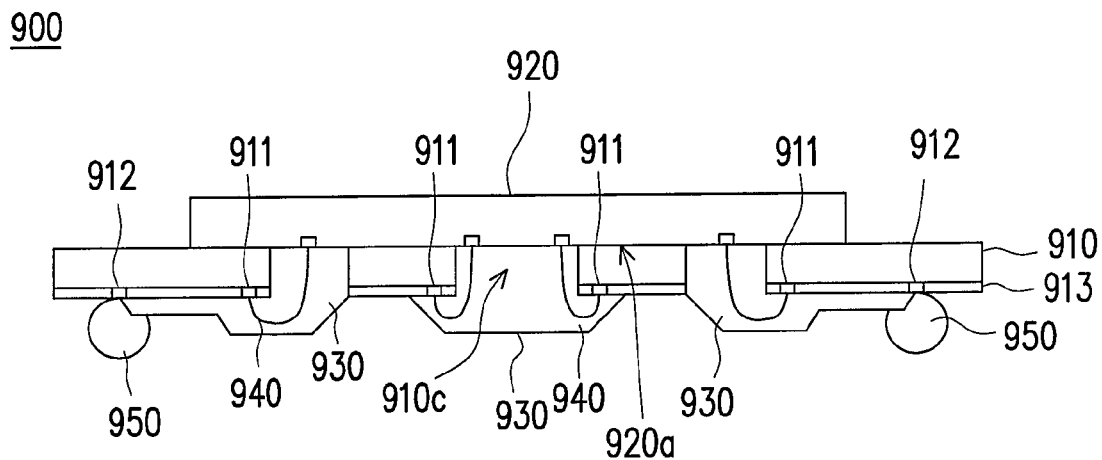
FIG. 1 is a schematic view of a conventional package structure.
Figure 2:
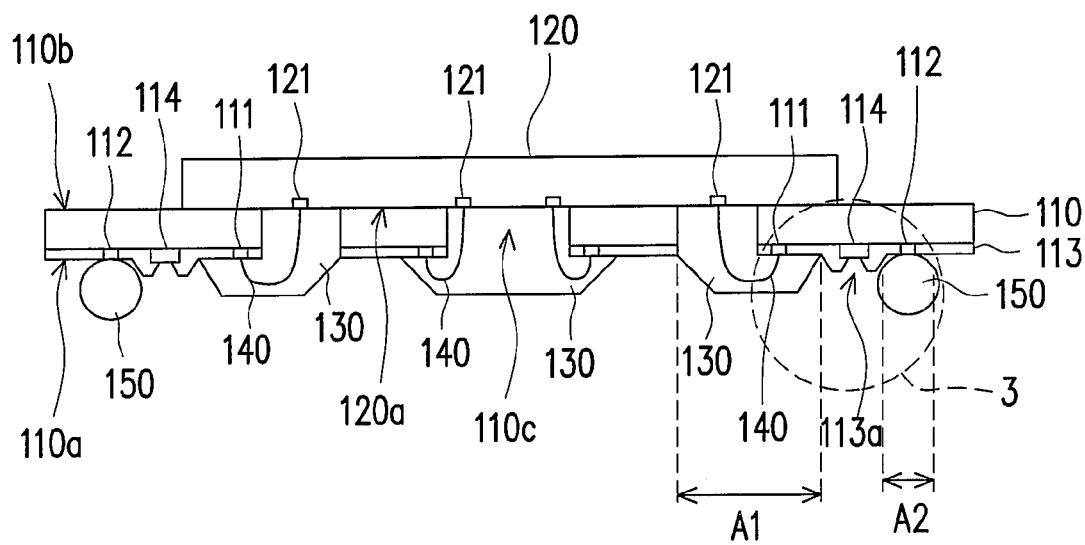
FIG. 2 is a schematic view of a package structure according to a first embodiment of the present invention.

Referring to FIG. 2, it is a schematic view of a package structure 100 according to a first embodiment of the present invention. The package structure 100 includes a package substrate 110, a chip 120, and a molding compound 130. The package substrate 110 has an upper surface 110b and a lower surface 110a. The lower surface 110a has a molding area A1 and a pad area A2. The molding area A1 has at least one window opening 110c penetrating the upper surface 110b and the lower surface 110a. The pad area A2 is used for disposing at least one solder ball or at least one connecting pin. In FIG. 2, a solder ball 150 is, for example, disposed on the pad area A2 for illustration. The package substrate 110 includes a solder mask 113 for covering the lower surface 110a of the package substrate 110. The solder mask 113 has at least one groove 113a disposed between the molding area A1 and the pad area A2, for preventing the molding compound 130 from contaminating the pad area A2. The chip 120 disposed on the package substrate 110 has an active surface 120a. The active surface 120a contacts with the upper surface 110b of the package substrate 110. The molding area A1 is covered by the molding compound 130.

In this embodiment, the package structure 100 is, for example, a WBGA package structure for illustration. As shown in FIG. 2, the molding area A1 and the pad area A2 of the WBGA package structure 100 are disposed on the same surface of the package substrate 110. However, any similar package structure can apply the design of the present invention, and as long as the molding area A1 and the pad area A2 are disposed on the same surface of the package substrate, the package structure can use the structural design of the present invention.

The package substrate 110 further has a solder-ball mounting pad 112 and a wire-bonding pad 111. The solder-ball mounting pad 112 is disposed in the pad area A2, and the wire-bonding pad 111 is disposed in the molding area A1. The solder-ball mounting pad 112 is used to electrically connect a solder ball 150, and the wire-bonding pad 111 is used to solder the bonding wire 140.

More particularly, the chip 120 further has a wire-bonding pad 121 disposed on the active surface 120a corresponding to the window opening 110c. The bonding wire 140 penetrates the window opening 110c and solders the wire-bonding pad 121 and the wire-bonding pad 111. In addition, the molding compound 130 further covers the active surface 120a of the chip 120, the wire-bonding pad 121, the bonding wire 140, and the wire-bonding pad 111.

Figure 3:
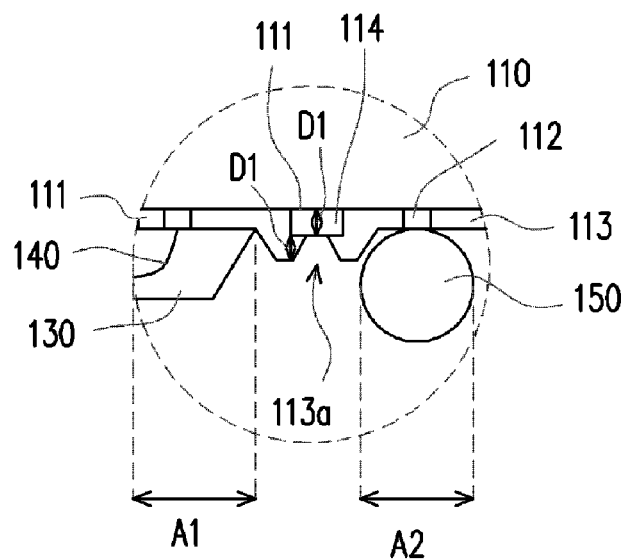
FIG. 3 is a partially-enlarged view of a dashed line 3 of FIG. 2.

Referring to FIG. 3, it is a partially-enlarged view of a dashed line 3 of FIG. 2. In this embodiment, the package substrate 110 further includes a dummy trace 114. The dummy trace 114 does not have any electric function, and the main function is to increase the thickness of the package substrate 110. The dummy trace 114 is disposed between the molding area A1 and the pad area A2. The solder mask 113 covers a part of the dummy trace 114. As shown in FIG. 3, the dummy trace 114 has a first thickness D1, such that the solder mask 113 covering the dummy trace 114 upraises for a height of the first thickness D1. Therefore, it is not easy for the molding compound 130 to flow across the upraised solder mask 113 from the molding area A1, such that it does not flow towards the solder-ball mounting pad 112 of the pad area A2.

In addition, as shown in FIG. 3, the groove 113a of the solder mask 113 exposes a part of the dummy trace 114. If the molding compound 130 flows across the upraised solder mask 113 by accident, the groove 113a of the solder mask 113 can be used as a buffer area for the mold flow of the molding compound 130. The over-flown molding compound 130 will flow into the groove 113a, instead of directly flowing into the solder-ball mounting pad 112 of the pad area A2.

Figure 4:
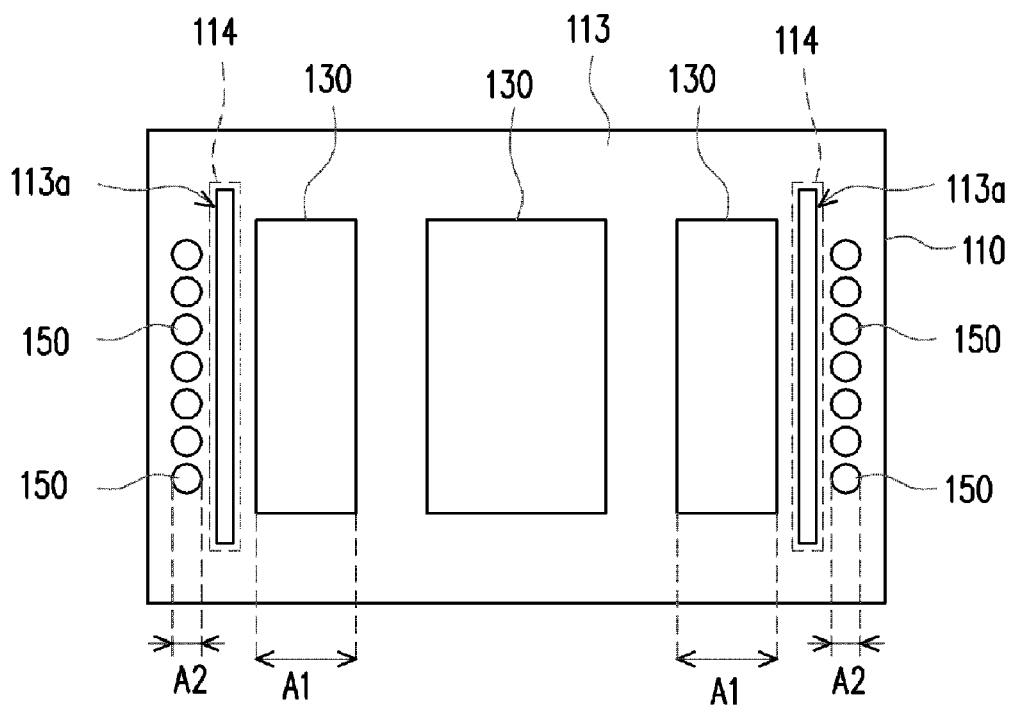
FIG. 4 is a back view of the package structure of FIG. 3.

Referring to FIG. 4, it is a back view of the package structure of FIG. 3. As shown in FIG. 4, the dummy trace 114 of this embodiment is substantially vertical to a connection line of the molding area A1 and the pad area A2. In FIG. 4, the dummy trace 114 covers under, the solder mask 113, so the dummy trace 114 is indicated by dashed line. In addition, the groove 113a disposed on the dummy trace 114 is substantially vertical to the connection line of the molding area A1 and the pad area A2. Therefore, the mold flow of the molding compound 130 effectively diffuses along the disposing direction of the dummy trace 114 and the groove 113a, instead of flowing towards the pad area A2.

Second Embodiment

Figure 5:
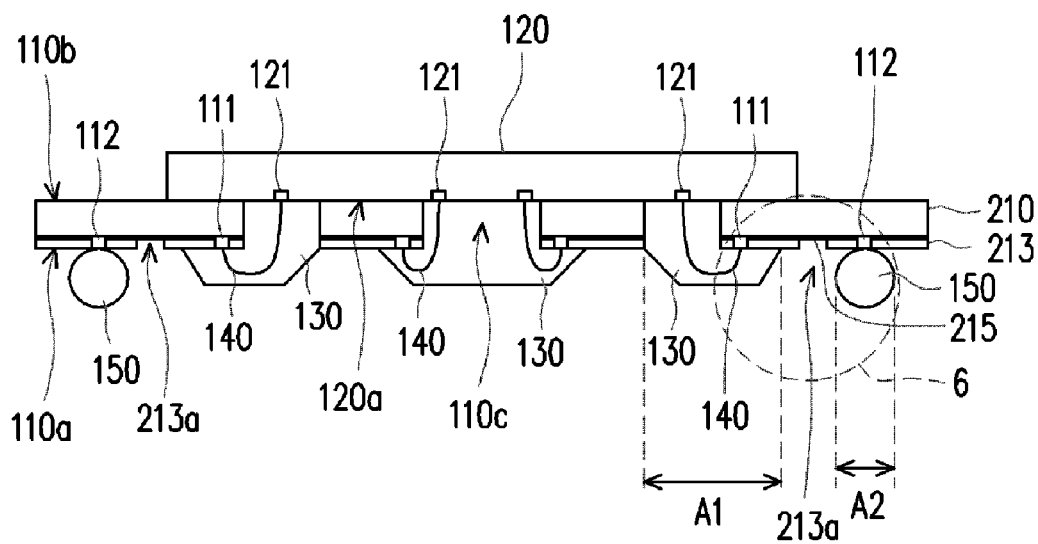
FIG. 5 is a schematic view of a package structure according to a second embodiment of the present invention.
Figure 6:
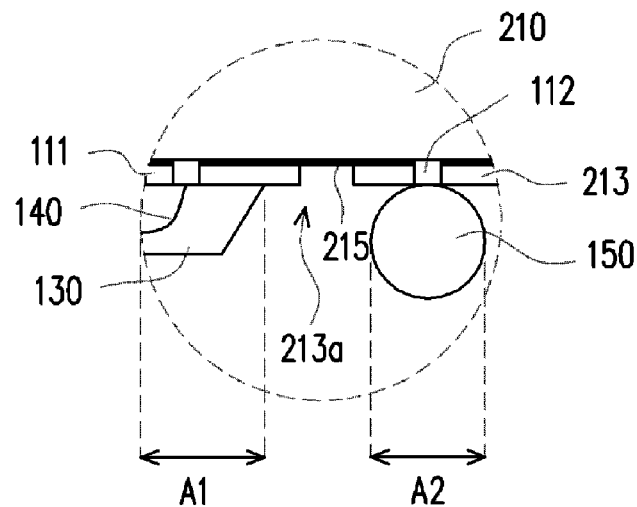
FIG. 6 is a partially-enlarged view of a dashed line 6 of FIG. 5.

The difference between a package structure 200 of this embodiment and the package structure 100 of the first embodiment lies in the structural design of a groove 213a of a package substrate 210, and the remaining parts are the same, which will not be described again herein. Referring to FIGS. 5 and 6, FIG. 5 is a schematic view of a package structure 200 according to a second embodiment of the present invention, and FIG. 6 is a partially-enlarged view of a dashed line 6 of FIG. 5. The package substrate 210 has an insulation layer 215 located on the top surface layer of the package substrate 210. In this embodiment, the package substrate 210 is not suitable for disposing the dummy trace between the molding area A1 and the pad area A2. The reason lies, in that, the internal circuits of the package substrate 210 are too dense, or the internal circuits between the molding area A1 and the pad area A2 does not allow the generation of parasitic capacitance, and thus, it is not suitable for disposing the dummy trace between the molding area A1 and the pad area A2. Therefore, the groove 213a of this embodiment directly exposes a part of the insulation layer 215. Therefore, when the mold flow of the molding compound 130 flows towards the solder-ball mounting pad 112 of the pad area A2, the groove 213a can be used as the buffer area for the mold flow. Therefore, the package structure 200 of this embodiment can also effectively prevent the molding compound 130 from contaminating the solder-ball-mounting pad 112 of the pad area A2.

Third Embodiment

Figure 7:
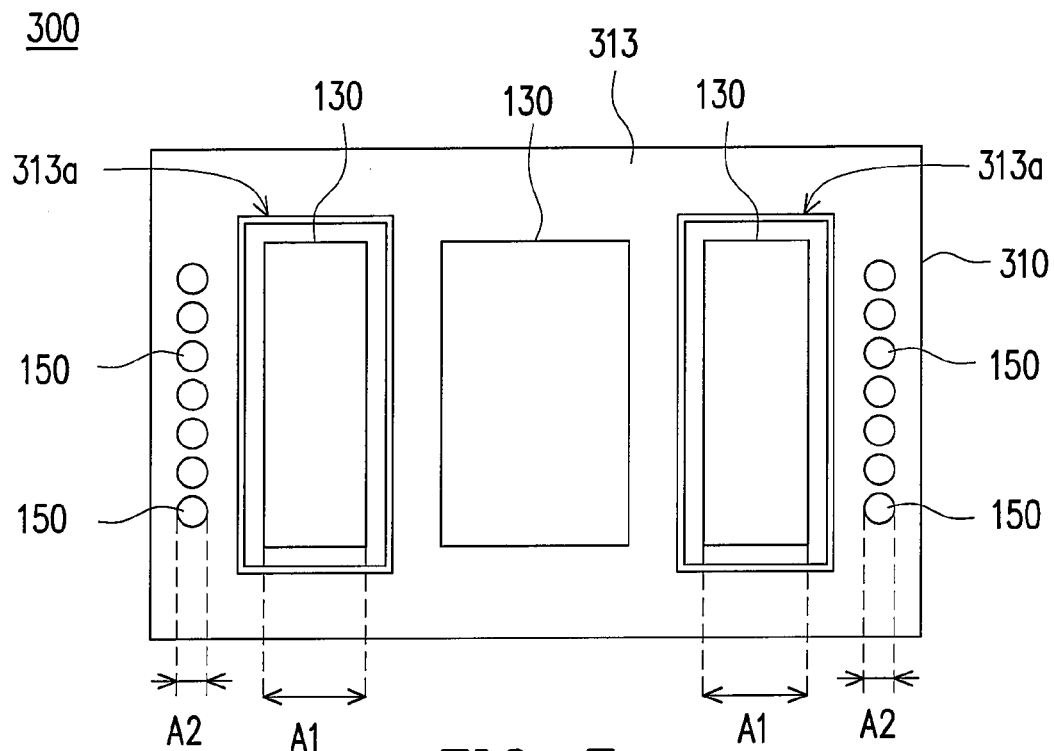
FIG. 7 is a back view of a package structure according to a third embodiment of the present invention.

The difference between a package structure 300 of this embodiment and the package structure 100 of the first embodiment lies in the disposing position of a groove 313a, and the remaining parts are the same, which will not be described again herein. Referring to FIG. 7, it is a back view of a package structure 300 according to a third embodiment of the present invention. In this embodiment, the groove 313a of a solder mask 313 surrounds the molding area A1. Under the condition that the package substrate 310 has sufficient space, besides the disposing manners mentioned in the first embodiment and the second embodiment, the groove 313a can also be disposed as surrounding the molding area A1, such that the mold flow of the molding compound 130 is restricted to flow in the area surrounded by the groove 313a.

Fourth Embodiment

Figure 8:
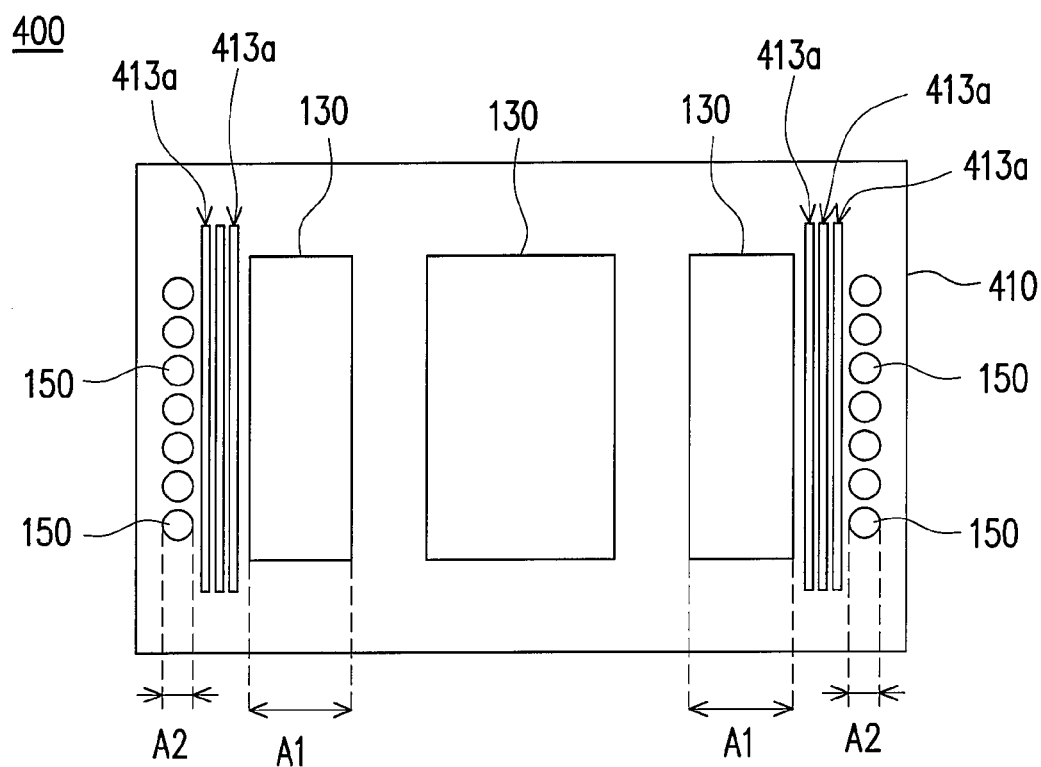
FIG. 8 is a back view of a package structure according to a fourth embodiment of the present invention.

The difference between a package structure 400 of this embodiment and the package structure 100 of the first embodiment lies in the number of grooves 413a, and the remaining parts are the same, which will not be described again herein. Referring to FIG. 8, it is a back view of a package structure 400 according to a fourth embodiment of the present invention. In this embodiment, a solder mask 413 has a plurality of grooves 413a parallel to each other. Therefore, a structure with a plurality of groups of peaks and valleys is formed between the molding area A1 and the pad area A2, such that the mold flow of the molding compound 130 must flow across the structure of peaks and valleys before reaching the pad area A2.

The package structure and the package substrate thereof provided by the embodiments of the present invention utilize the structural design of the solder mask with the groove, so as to prevent the mold flow of the molding compound flowing from the molding area to the pad area, such that the package structure and the package substrate thereof at least have the following advantages.

Firstly, "the molding compound is effectively prevented from contaminating the pad area". The solder mask has the design of the groove, such that the direction of the mold flow of the molding compound is controlled, and the buffer area for the mold flow of the molding compound is offered.

Second, "it is suitable for the package substrate with dense internal circuits". With the above design, when the package substrate is not suitable for disposing the dummy trace between the molding area and the pad area or the internal circuit between the molding area and the pad area does not allow the generation of parasitic capacitance, the groove of the solder mask can still be used to achieve the objective of the present invention.

Third, "the defective rate is lowered". As described above, with the above design, the pad area can be effectively protected from being contaminated, so as to greatly reduce the defective rate of the package structure.

Fourth, "the manufacturing cost is not increased additionally". During the process of manufacturing the package substrate, the step of forming the solder mask does not require any additional material or table. Therefore, under the condition of without increasing the manufacturing cost, it is possible to effectively prevent the molding compound from contaminating the pad area, and it is quite convenient.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package structure, comprising:
a package substrate, having an upper surface and a lower surface, wherein the lower surface has a molding area and a pad area, the molding area has at least one window opening penetrating the upper surface and the lower surface, and the pad area is used to dispose at least one solder ball or at least one connecting pin, the package substrate comprising:
a solder mask, covering the lower surface of the package substrate, and having at least one groove disposed between the molding area and the pad area;
a chip, having an active surface, disposed on the package substrate, wherein the active surface contacts with the upper surface of the package substrate; and
a molding compound, covering the molding area, but without covering the at least one groove disposed between the molding area and the pad area, wherein the at least one groove exposes an insulation layer of the package substrate or the at least one groove exposes a dummy trace located outside of the molding area.

2. The package structure as claimed in claim 1, wherein the lower surface of the package substrate further has at least one first wire-bonding pad used for bonding a bonding wire and disposed in the molding area; and the chip, the bonding wire, and the wire-bonding pad are covered by the molding compound.

3. The package structure as claimed in claim 2, wherein the chip further has a second wire-bonding pad corresponding to the window opening; and the bonding wire penetrates the window opening and bonds the first wire-bonding pad and the second wire-bonding pad.

4. The package structure as claimed in claim 1, wherein the dummy trace is substantially vertical to a connection line of the molding area and the pad area.

5. The package structure as claimed in claim 1, wherein the groove is substantially vertical to the connection line of the molding area and the pad area.

6. The package structure as claimed in claim 1, wherein the groove surrounds the molding area.

7. The package structure as claimed in claim 1, wherein the package substrate further has at least one solder-ball mounting pad disposed in the pad area.

8. The package structure as claimed in claim 1, wherein the package structure is a window ball grid array (WBGA) package structure.

9. The package structure as claimed in claim 1, wherein the solder mask has a plurality of grooves parallel to each other.

10. A package substrate, having an upper surface and a lower surface, wherein the lower surface has a molding area and a pad area, the molding area is used to dispose a molding compound and has at least one window opening penetrating the upper surface and the lower surface, the pad area is used to dispose at least one solder ball or at least one connecting pin, the package substrate comprising:
a solder mask, covering the lower surface of the package substrate, and having at least one groove disposed between the molding area and the pad area, wherein the at least one groove is disposed outside of the molding area, and the at least one groove exposes an insulation layer of the package substrate or the at least one groove exposes a dummy trace located outside of the molding area.

11. The package substrate as claimed in claim 10, wherein the lower surface of the package substrate further has at least one wire-bonding pad used for bonding a bonding wire and disposed in the molding area; and the bonding wire and the wire-bonding pad are covered by the molding compound.

12. The package substrate as claimed in claim 10, wherein the dummy trace is substantially vertical to a connection line of the molding area and the pad area.

13. The package substrate as claimed in claim 10, wherein the groove is substantially vertical to the connection line of the molding area and the pad area.

14. The package substrate as claimed in claim 10, wherein the groove surrounds the molding area.

15. The package substrate as claimed in claim 10, wherein the package substrate further has at least one solder-ball mounting pad disposed in the pad area.

16. The package substrate as claimed in claim 10, wherein the solder mask has a plurality of grooves parallel to each other.

* * * * *